United States Patent [19]
Hu et al.

[11] Patent Number: 5,982,003
[45] Date of Patent: Nov. 9, 1999

[54] SILICON-ON-INSULATOR TRANSISTORS HAVING IMPROVED CURRENT CHARACTERISTICS AND REDUCED ELECTROSTATIC DISCHARGE SUSCEPTIBILITY

[75] Inventors: Chenming Hu, Alamo; Mansun John Chan, Fremont; Hsing-Jen Wann, Albany; Ping Keung Ko, Richmond, all of Calif.

[73] Assignee: The Regents of the University of California, Oakland, Calif.

[21] Appl. No.: 08/461,355

[22] Filed: Jun. 5, 1995

Related U.S. Application Data

[62] Division of application No. 08/224,363, Apr. 7, 1994, Pat. No. 5,489,792.

[51] Int. Cl.$^6$ ............... H01L 27/01; H01L 27/12; H01L 31/0392; H01L 29/04
[52] U.S. Cl. ............................. 257/347; 257/60
[58] Field of Search ....................... 257/60, 347

[56] References Cited

U.S. PATENT DOCUMENTS

| | | | |
|---|---|---|---|
| 4,954,855 | 9/1990 | Mimura et al. | |
| 5,095,348 | 3/1992 | Houston | |
| 5,116,771 | 5/1992 | Karulkar | |
| 5,159,416 | 10/1992 | Kudoh | 257/347 |
| 5,164,805 | 11/1992 | Lee | 257/351 |
| 5,187,113 | 2/1993 | Tyson et al. | |
| 5,212,574 | 5/1993 | Katayama et al. | 359/59 |
| 5,293,053 | 3/1994 | Malhi et al. | 257/330 |

FOREIGN PATENT DOCUMENTS

| 523800 | 1/1993 | European Pat. Off. |
|---|---|---|

*Primary Examiner*—Stephen D. Meier
*Attorney, Agent, or Firm*—Townsend and Townsend and Crew LLP; Henry K. Woodward

[57] ABSTRACT

An SOI MOSFET having improved electrical characteristics includes a low barrier body contact under the source region, and alternatively under the drain region, to facilitate collection and removal of current carriers generated by impact ionization. Fully-depleted and non-fully-depleted SOI MOSFETs can be integrated on the same chip by providing some transistors with thicker source and drain regions with a recessed channel therebetween and by selective channel dopant implant. Accordingly, digital circuitry and analog circuitry can be combined on one substrate. Improved electrostatic discharge protection is provided by fabricating transistors for the protection circuit directly in the supporting substrate by first removing the silicon thin film and underlying insulation barrier. Alternatively, improved transistors for electrostatic discharge protection can be formed in the silicon film by fabricating the transistor in a plurality of electrically isolated segments, each segment having source and drain regions separated by a channel region with the regions being electrically interconnected with like regions in other segments. Increased ESD current can be realized as compared to the ESD current for a wider unsegmented device.

2 Claims, 7 Drawing Sheets

SILICON-ON-INSULATOR TRANSISTORS HAVING IMPROVED CURRENT CHARACTERISTICS AND REDUCED ELECTROSTATIC DISCHARGE SUSCEPTIBILITY

This is a Division of application Ser. No. 08/224,363, filed Apr. 7, 1994 now U.S. Pat. No. 5,48,9792.

This invention was made with Government support under Contract No. F49620-93-C-0014 awarded by the Air Force Office of Scientific Research/Joint Services Electronics Program. The Government has certain rights to this invention.

BACKGROUND OF THE INVENTION

This invention relates generally to semiconductor devices, and more particular the invention relates to field effect devices fabricated in silicon-on-insulator structures.

Silicon-on-insulator (SOI) technology employs a layer of semiconductor material overlying an insulation layer on a supporting bulk wafer. The structure can be formed by a number of well-known techniques, such as zone melting and recrystallization (ZMR), separation by implanted oxygen (SIMOX), or Bonded and Etchback (BESOI). Typically, the structure comprises a film of monocrystalline silicon on a buried layer of silicon oxide in a monocrystalline silicon substrate.

Field effect transistors such as MOSFETs fabricated in the silicon film of an SOI structure have many advantages over MOSFETs fabricated on the traditional bulk silicon substrates including resistance to short-channel effect, steeper subthreshold slopes, increased current drive, higher packing density, reduced parasitic capacitance, and simpler processing steps. In the past, the range of SOI applications has been limited due to high cost and inferior crystalline quality of SOI wafers. However, recent advancements in the SOI silicon film quality, buried oxide quality, and manufacturing throughput have opened the door to a multitude of ultra large scale integration (ULSI) applications. Combined with the continually increasing cost of bulk silicon submicron integrated circuit processes and the lower complexity/cost of SOI integrated circuit processes, SOI technology shows great potential to become the low cost mainstream production technology.

Despite all of the attractiveness of SOI technology, there are obstacles which cancel part of the benefit of using SOI for high-performance, high-density ULSI circuits. The problem is especially severe for analog circuits or mixed-mode circuits, which contain both analog and digital circuits.

Figure 1:
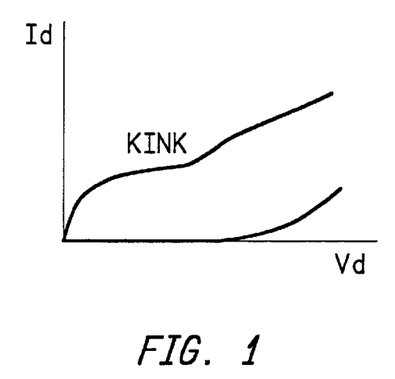
FIG. 1 is a plot of I-V characteristics for a non-fully-depleted SOI device.

MOSFETs fabricated with SOI technology include non-fully depleted MOSFETs with silicon film thickness greater than the maximum channel depletion width and fully-depleted MOSFETs having silicon film thickness less than the maximum channel depletion width. Unlike bulk silicon MOSFETs, the substrate of an SOI MOSFET is usually electrically floating. In a non-fully depleted MOSFET, carriers (holes in nMOSFETs and electrons in pMOSFETs) generated by impact ionization accumulate near the source/body junction of the MOS transistor, and eventually sufficient carriers will accumulate to forward bias the body with respect to the source thus lowering the threshold voltage through the body-bias effect. Extra current will start flowing resulting in a "kink" in the I-V characteristics as shown in FIG. 1. This reduces the achievable gain and dynamic swing in analog circuits, and gives rise to abnormality in the transfer characteristics in digital circuits.

Figure 2:
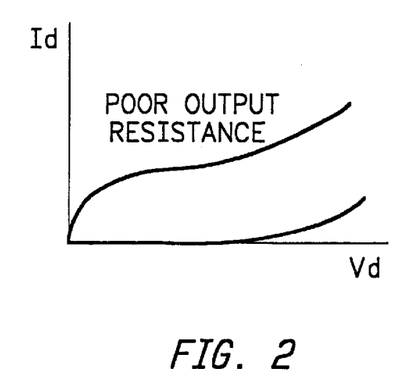
FIG. 2 is a plot of I-V characteristics for a fully-depleted SOI device.

In a fully-depleted SOI MOSFET, the channel is depleted completely under normal operations. The source/channel junction has a lower potential barrier, and the carriers generated by impact ionization have smaller effect on the body and channel potential, thus the "kink" softens. But the resulting output resistance as illustrated in FIG. 2 is poor, thus making SOI technology less attractive than conventional bulk technology in analog circuits.

Furthermore, in fully-depleted MOSFETs, the depletion charge is reduced for a given body doping concentration, leading to a smaller threshold voltage.

Threshold voltage becomes very sensitive to variations in the silicon film thickness, which makes the fabrication of high performance circuits very difficult. Additionally, the reduction of silicon film thickness in a fully-depleted MOSFET gives rise to high source/drain series resistance which in turn lowers the device operation speed. Silicidation can help improve the series resistance, but it will create mechanical stress and the process is hard to control on thin film silicon. One solution to the series resistance problem is to selectively reduce the silicon film thickness over the channel region. However, the resulting recessed region and the polysilicon gate are not automatically aligned. To allow for the possible misalignment, the recessed thin silicon region must be made longer than the gate. This reduces the device performance and density, and results in asymmetrical devices.

Another problem common to both fully-depleted and non-fully-depleted SOI MOSFETs is the parasitic floating-base lateral bipolar transistor existing in parallel with SOI MOSFETs. Band-to-band tunneling generated (GIDL) drain leakage and drain/body junction leakage due to thermal generation are multiplied by the gain of the parasitic bipolar junction transistor, which might be as high as 100. Low breakdown voltage and anomalously steep subthreshold slope due to a decreasing threshold voltage has been observed.

Problems due to the floating body can be solved by providing a contact to the body for hole current collection. However, the currently available hole collection schemes, including the use of a side-contact or the use of a mosaic source are very inefficient and consume significant amounts of device area. A dual source structure has been proposed which depends on an aluminum spiking phenomenon to make contact to the P region, which is sensitive to process variations.

Further, the structure is not compatible with VLSI junction and contact technology such as silicidation.

Another major obstacle to the use of SOI technology in production is electrostatic discharge (ESD) susceptibility. In bulk-substrate technology, good ESD protection levels have been demonstrated by using nMOS/CMOS buffers. However, this protection scheme is not compatible with SOI structures. For example, thick-field-oxide devices are not available on an SOI substrate. Large-area low-series-resistance (vertical) PN junctions are not available as the silicon film can be thinner than 100nm. Experimental results demonstrate that ESD performance on SOI wafers are much worse than bulk technology. This can be due to two reasons, namely the poor thermal conductivity of the buried oxide enhances the failure due to Joule heating, and the reduction of silicon film thickness and junction depth increases the ESD current density. Severe localized silicon heating can result, which causes junction melting and polysilicon melt filaments to form, which cause electrical shorts among the gate, source, drain and body of the transistors and result in device failure. ESD protection schemes designed for SOI circuits have been proposed using additional circuits constructed with diodes and polysilicon resistors, however these devices consume large silicon area, introduce large delays, and are far from adequate.

The present invention is directed to providing SOI transistors which overcome or reduce the above problems.

SUMMARY OF THE INVENTION

Briefly, in accordance with the invention, a low barrier body contact is provided under at least the source of an SOI transistor to collect current generated by impact ionization, junction leakage, and tunneling. For an nMOSFET, a P-doped region is provided under the N⁻ source region. A side contact can be provided to the underlying current collecting region, or tunneling conduction from the underlying region to the overlying source region can accommodate the collected current.

In accordance with another feature of the invention, thicker source/drain regions are provided with the channel region therebetween recessed to reduce series resistance and increase operating speed of the transistor. Transistors with different conduction voltages, $V_T$, can be accommodated by the channel thinning and by threshold dopant implant into the channel region. Thus, fully-depleted SOI MOSFETs and non-fully-depleted SOI MOSFETs can be integrated on the same chip. Fully depleted SOI transistors with recessed channel structures are suitable for digital circuits because of suppression of punch-through and the kink effect. Non-fully-depleted SOI MOSFETs with the low barrier body contact are ideal for analog applications, but require a thicker body.

Both analog and digital transistors can thus be accommodated on the same chip giving ultimate integration for a wide range of circuit applications. A self-aligned gate and recessed channel process is provided in accordance with the invention.

To provide electrostatic discharge (ESD) protection, buffer transistors can be fabricated directly in the substrate adjacent to an SOI transistor by first removing the semiconductor film and buried oxide layer. The fundamental problem of thermal isolation due to the buried oxide is thus eliminated. In an alternative embodiment using an SOI transistor for ESD protection, the transistor is fabricated in electrically isolated islands or in physically isolated mesas, so that each island or mesa can have at least one conducting filament and absorbs some amount of ESD energy. The total ESD energy is thus spread among the isolated regions, whereas in a bulk SOI transistor the ESD current tents to concentrate at a few hot filaments which can lead to device failure.

The invention and objects and features thereof will be more fully understood from the following detailed description and appended claims when taken with the drawing.

DETAILED DESCRIPTION OF ILLUSTRATIVE EMBODIMENTS

Features of the invention will be described with reference to specific nMOSFET embodiments, but it will be appreciated that the invention applies to pMOSFETs as well.

Figure 3:
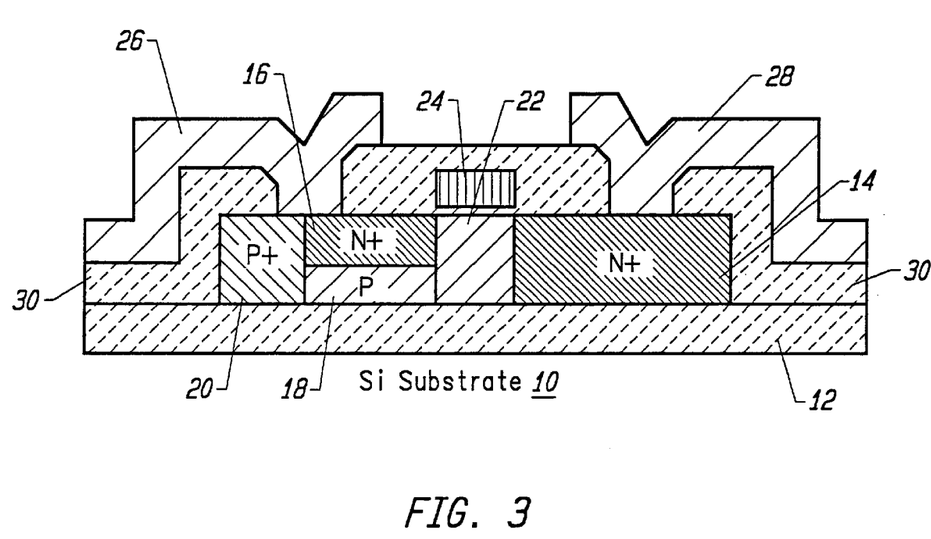
FIG. 3 is a section view of an SOI MOSFET in accordance with one embodiment of the invention.

Referring to FIG. 3, an nMOSFET having a low barrier body contact source region in accordance with the invention is illustrated in cross-section. As in a typical SIMOX structure, a silicon substrate 10 has a buried silicon oxide layer 12 therein with the transistor fabricated in an overlying monocrystalline silicon film. The transistor includes an N⁺ doped drain region 14 and an N₊ doped source region 16 formed over a P doped body contact 18. P₊ region 20 abutting the source 16 and body contact 18 provides a current path for the impact ionization current accumulated in region 18 near the source/body junction. The source region 16 and drain region 14 are separated by a channel region 22 with a polysilicon gate contact 24 overlying the channel region 22 and insulated therefrom by silicon oxide. Metal or polysilicon interconnect lines 26, 28 are interconnected with the source and drain, respectively, with the P₊ region 20 also connected to the source contact line 26.

The P region 18 underlying the source region, either neutral or depleted, provides a low resistance path to collected hole current generated by impact ionization, junction leakage, and GIDL. The P implant for the underlying P region 18 is on the order of $1 \times 10^{14}$ to $1 \times 10^{16}$ dopant atoms per $cm^{-2}$. The N+ implant for the source and drain is higher in dopant concentration with a lower implant energy level to form the shallower N+ doped regions. The P− doped low barrier contact can be provided under both the source and drain for a simpler fabrication process. The P+ contact 20 is formed after the N+ implant.

Figure 4:
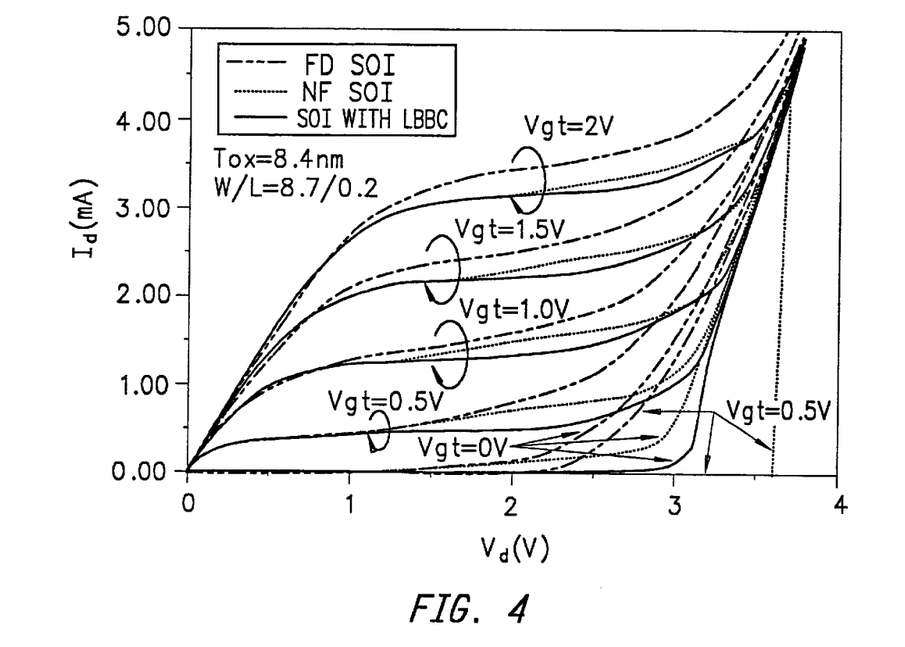
FIG. 4 is a graph illustrating a comparison of performance between conventional and SOI MOSFETs in accordance with the structure of FIG. 3.

FIG. 4 is a plot illustrating a comparison of performance-between conventional SOI MOSFETs and MOSFETs with the low barrier body contact, as illustrated in FIG. 3. The kink effect in non-fully-depleted SOI MOSFETs is completely removed and the bipolar induced problems are suppressed. The low barrier body contact MOSFETs exhibit higher breakdown voltage, especially for low gate voltages, and a very constant saturated drain current which is free of the kink. The resulting device has all of the advantages of a bulk MOSFET in addition to the better short channel behavior and lower capacitance advantages of SOI structures, which is ideal for analog circuits.

The low barrier body contact structure in accordance with the invention is capable of collecting carriers uniformly across the channel with a much higher efficiency than the conventional side substrate contact or the mosaic source while requiring less surface area than the conventional schemes. Some transistors in a circuit can be designed to have the low barrier body contact structures while others have floating bodies in order to perform pass-gate functions or have the larger current of a floating body MOSFET. Even without the current collection P region (N region for P MOSFETs) beneath the source, the carriers can still be collected by the source if the doping concentration at the bottom of the source is sufficiently low to provide a low barrier for collecting the impact ionization generated carriers.

Figure 5:
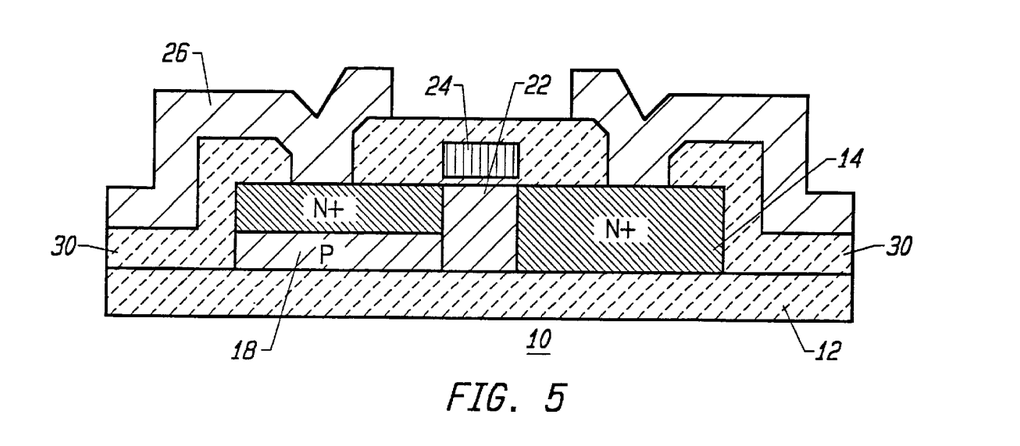
FIG. 5 is a section view of another embodiment of an SOI MOSFET in accordance with the invention.

FIG. 5 is a section view of another embodiment of the invention in which the P+ layer is placed beneath the N+ source, and contact is made only to the N+ source. Like elements in FIGS. 3 and 5 have the same reference numerals. Instead of relying on the non-uniform, therefore uncontrolled, spiking of contact, the electrical current between the N+ and P+ regions is carried out by uniform tunneling conduction between the N+ and P+ silicon as is the well-known mechanism of the operation of a tunnel diode. Even though the N+ regions at the source and drain are of different depths, they can be created by the same N+ implantation.

In the embodiments of FIGS. 3 and 5, the low barrier body contact is provided only under the source region of the SOI MOSFET. However, a similar low barrier body contact can be provided under the drain region thereby providing a symmetrical transistor structure which is desirable for applications such as a pass-gate circuit.

Figure 6A:
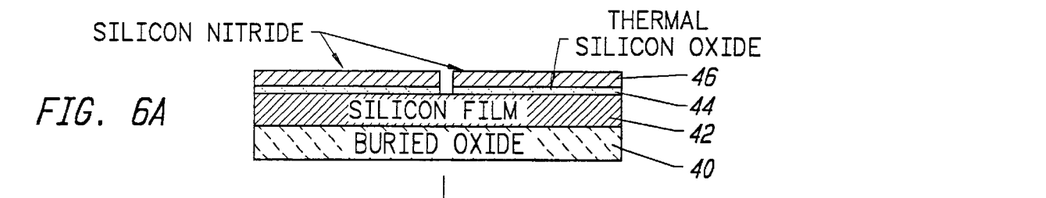
FIGS. 6A–6F are section views illustrating the fabrication of a self-aligned recessed channel SOI MOSFET in accordance with the invention.
Figure 6B:
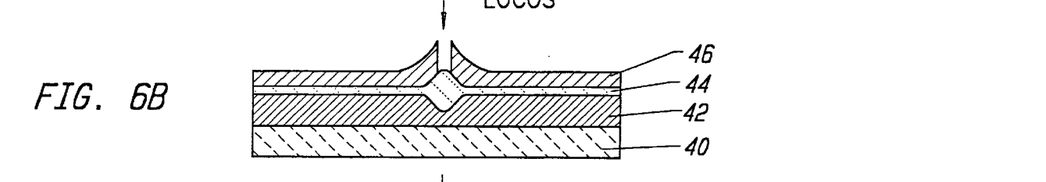
Figure 6C:
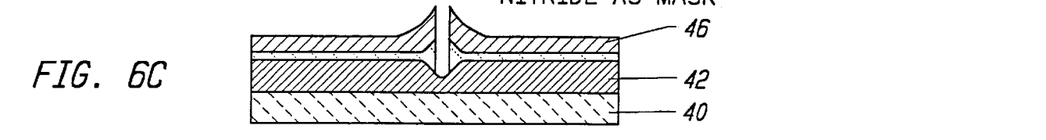
Figure 6D:
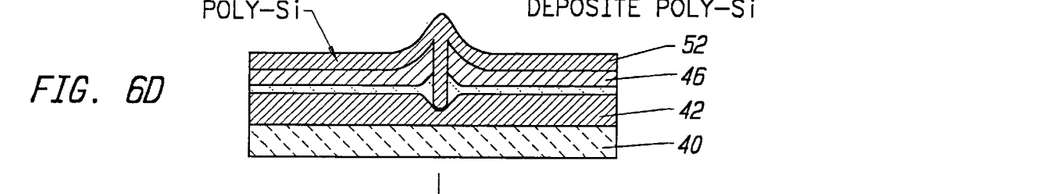
Figure 6E:
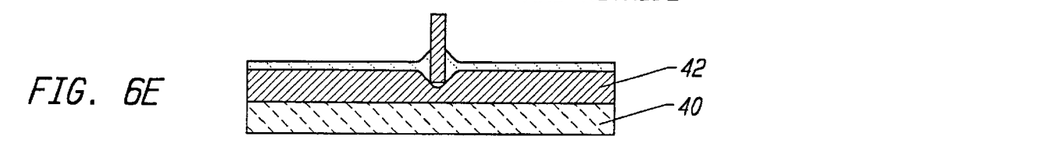
Figure 6F:
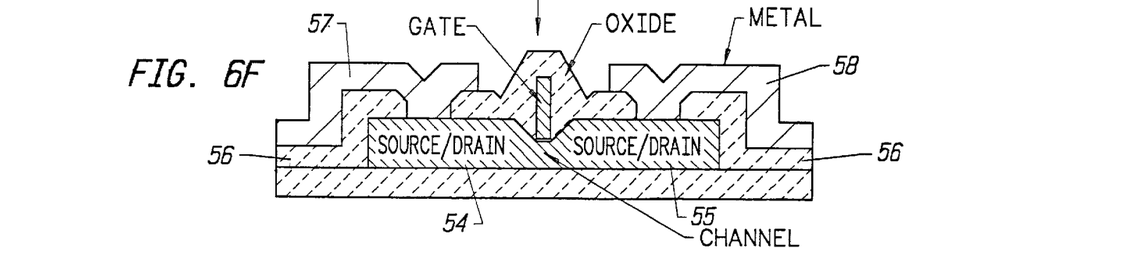

In accordance with another feature of the invention, a thicker film of silicon is employed for the source and drain regions to reduce series source/drain resistance and increase operation speed. Further, non-fully-depleted SOI MOSFETs require a thicker body. However, the thicker source and drain regions require a thinning of the channel region therebetween. FIGS. 6A–6F are section views illustrating a method of fabricating a self-aligned gate and recessed channel structure in accordance with a feature of the invention. In FIG. 6A a substrate (not shown) has a barrier oxide 40 therein with a thicker silicon film 42 thereon. A thin layer of silicon oxide 44 is grown on the surface of the silicon film and a layer of silicon nitride 46 is deposited on the oxide layer. A window 48 is then etched through the nitride and oxide layers. Thereafter, a sacrificial LOCOS oxide 50 is grown through window 48 into the silicon layer 42 to thin the silicon film where the MOSFET channel will be. An oxide etch is then employed using the nitride layer 46 as a mask to expose the channel region of the silicon film, as shown in FIG. 6C. In FIG. 6D, gate oxide is grown on the exposed surface of the silicon film and a polysilicon layer 52 is then formed in the etched hole and over the surface of the silicon nitride. In FIG. 6E, the polysilicon film and nitride are removed, leaving the polysilicon gate electrode 53 aligned over the channel region and separated therefrom by the gate oxide from FIG. 6D. Finally, in FIG. 6F, dopant ions are implanted in the source and drain regions using the gate electrode for self-alignment, oxide 56 is deposited and selectively etched, and metal source and drain interconnect lines 57 and 58 interconnect the transistor structure. In addition to the thicker source/drain regions which can be provided, ultrathin film SOI transistors down to 10 nm can be fabricated using this technique without a problem of the source and drain regions being consumed during contact opening and metallization.

Circuit operating voltage must be reduced in order to reduce power consumption. When the operating voltage is lowered, the MOSFET threshold voltage ($V_T$) must be lowered in order to obtain larger currents and higher circuit speed. Unfortunately, a low $V_T$ leads to large transistor leakage, which increases power consumption. By using the low barrier body contact and recessed channel structure of the invention, MOSFETs in a speed-sensitive and leakage-insensitive portion of the circuit can have lower $V_T$ while other MOSFETs have a higher $V_T$ through use of dual silicon film thickness produced in the recessed channel structure. Differences in $V_T$ can be controlled by performing threshold adjust implants before or after the LOCOS thinning step (FIG. 6B) and by adjusting the amount of additional uniform thinning after the LOCOS thinning step. Different $V_T$ for each of P and N channel transistors can be obtained by masking the $V_T$ implant for some transistors with a photoresist mask and using the dual silicon film thickness. Two additional $V_T$ can be obtained by implanting P channel threshold adjust ions into N channel transistors, and vice versa for pMOSFETs. The use of different silicon film thicknesses on the same chip makes device design very flexible. Fully-depleted SOI MOSFETs and non-fully-depleted SOI MOSFETs can be integrated on the same chip with the fully-SOI transistors with a recessed channel structure being particularly useful for digital circuits because of suppression of punch-through and the kink effect. Non-fully-depleted SOI MOSFETs with a low barrier body contact are ideal for analog applications but require a thicker body, all of which being accommodated on the same chip in accordance with the invention to give ultimate integration covering a wide range of applications.

Figure 7:
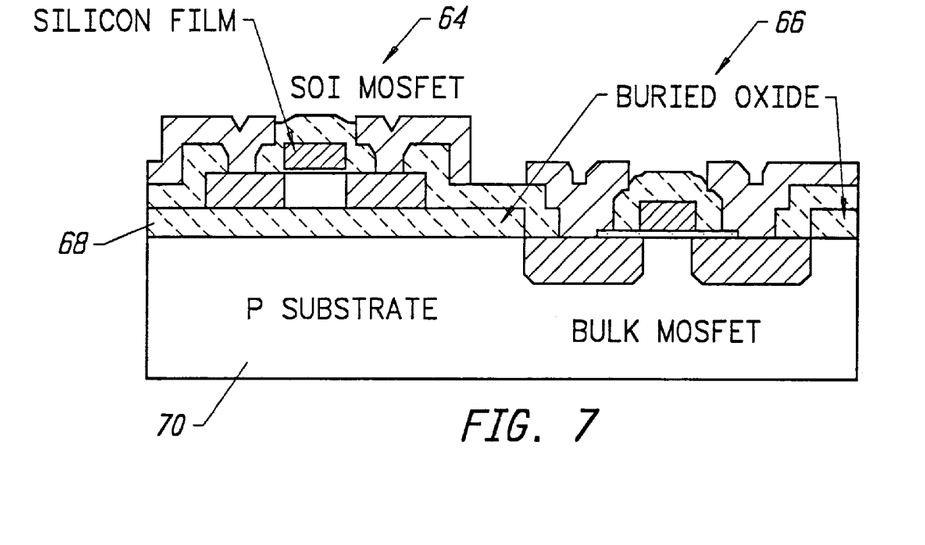
FIG. 7 is a section view of an SOI MOSFET and a bulk MOSFET for ESD protection in accordance with the invention.
Figure 8:
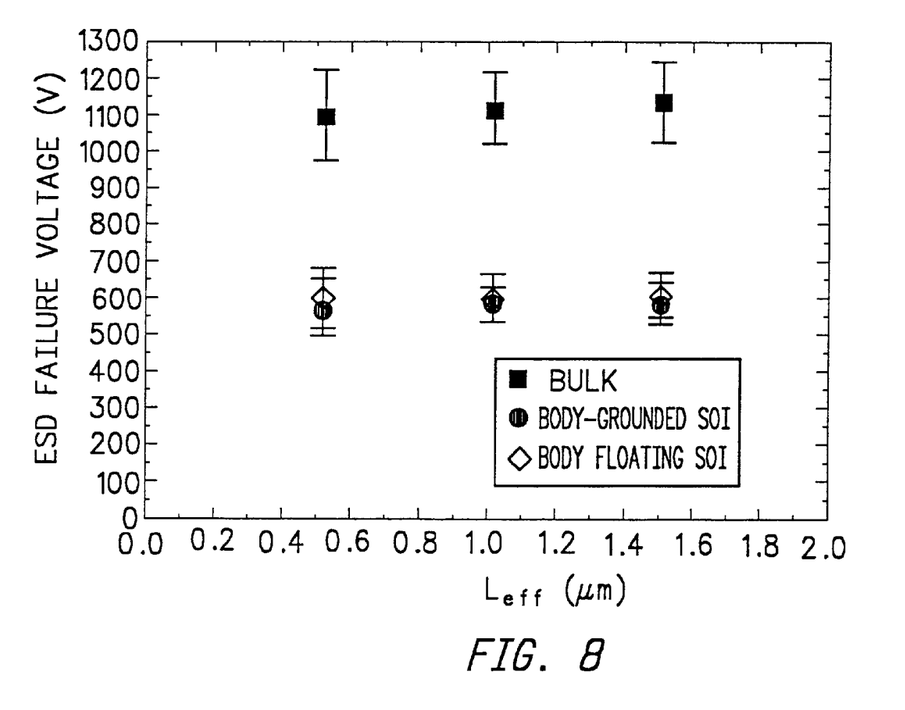
FIGS. 8 and 9 are graphs illustrating ESD failure voltage of nMOSFETs having different $L_{eff}$ under positive ESD stress.
Figure 9:
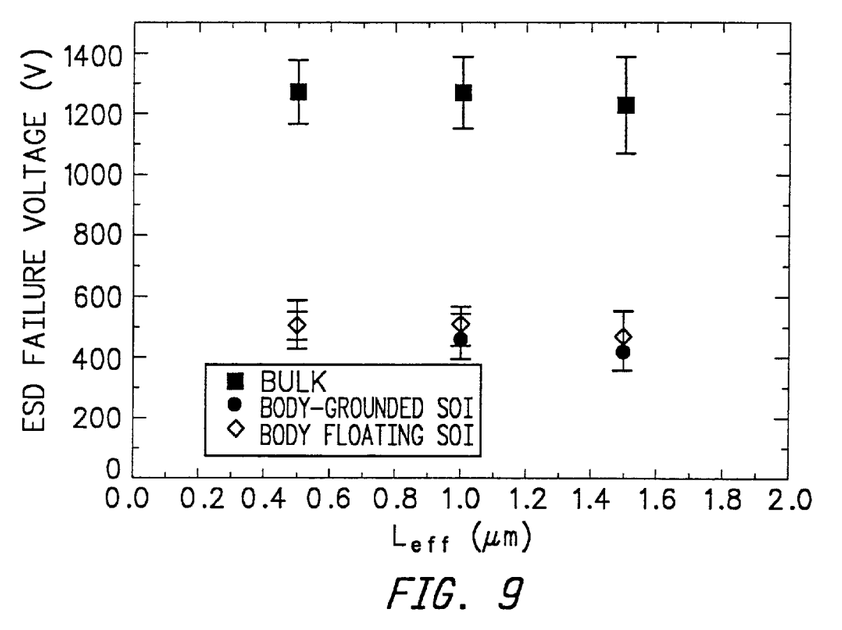

In accordance with another aspect of the invention, electrostatic discharge (ESD) protection can be incorporated in SOI MOSFET circuits. In accordance with one embodiment shown in cross-section in FIG. 7, an SOI MOSFET 64 can be fabricated on the oxide layer 68 of substrate 70, while adjacent to transistor 64 a bulk MOSFET 66 is fabricated directly in substrate 70 by etching through the silicon film and buried oxide to create an opening to expose the silicon substrate in which the transistor 66 is fabricated. ESD protection circuits including nMOS buffers, pMOS buffers or CMOS buffers can then be fabricated on the silicon substrate at these openings. Accordingly, most of the bulk ESD protection circuits are directly transferred to the SOI technology, thus saving time and effort of developing special circuits for SOI ESD protection. The fundamental problem of thermal isolation due to the buried oxide in SOI technology is eliminated, hence giving more flexibility for building the ESD protection circuits. Experimental results demonstrate that ESD protection circuits built directly in the substrate are capable of withstanding higher ESD discharge voltage during the human-body-model stress compared with ESD protection circuits build on conventional SOI circuits for both positive and negative discharge pulses. For negative discharges, conventional SOI NMOS transistors in the buffer are operated in the so-called transistor-diode mode. The series resistance in this operating mode is too large for SOI technology to provide satisfactory ESD protection. However, with bulk MOSFETs, the negative discharge pulses are absorbed by the large drain-to-substrate diode which can accommodate larger ESD currents. The results are summarized in the plots of FIGS. 8 and 9 which show ESD failure voltage of different nMOSFETs with different $L_{eff}$ under positive ESD stress. The transistors have $W_{eff}$ of 250 μm, $T_{ox}$ of 9 nm, and 2 μm contact-to-gate spacing.

Figure 10:
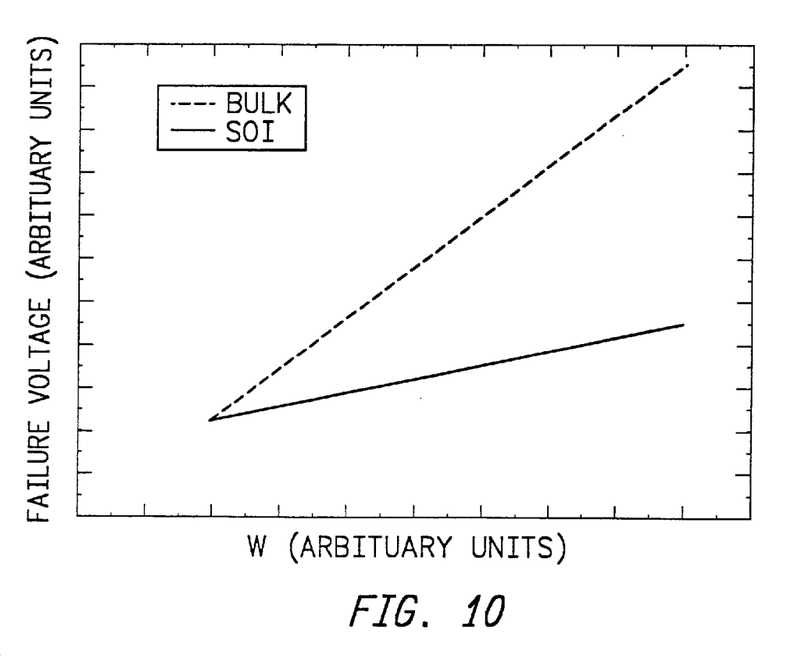
FIG. 10 is a plot of ESD failure voltage as a function of channel width.
Figure 11:
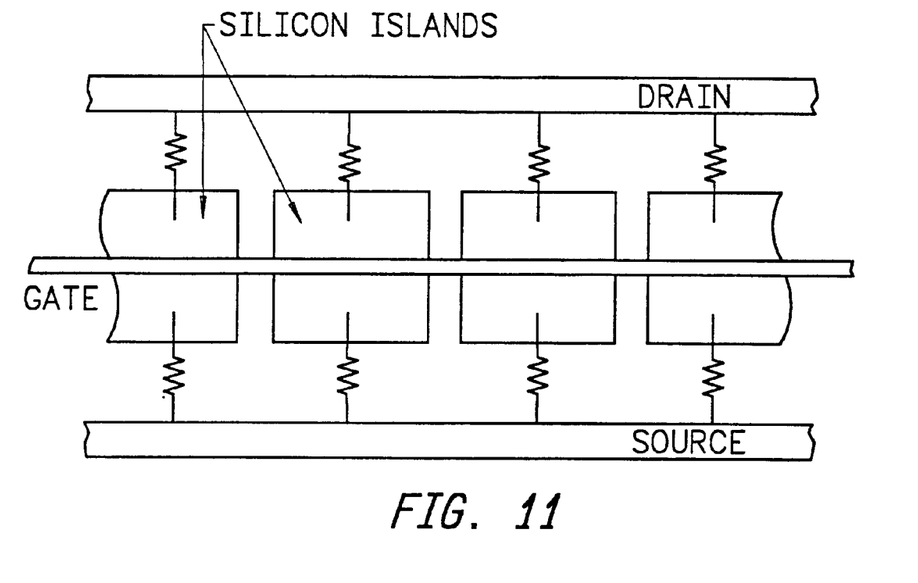
FIGS. 11 and 12 are plan views of multiple island ESD production devices in accordance with the invention.
Figure 12:
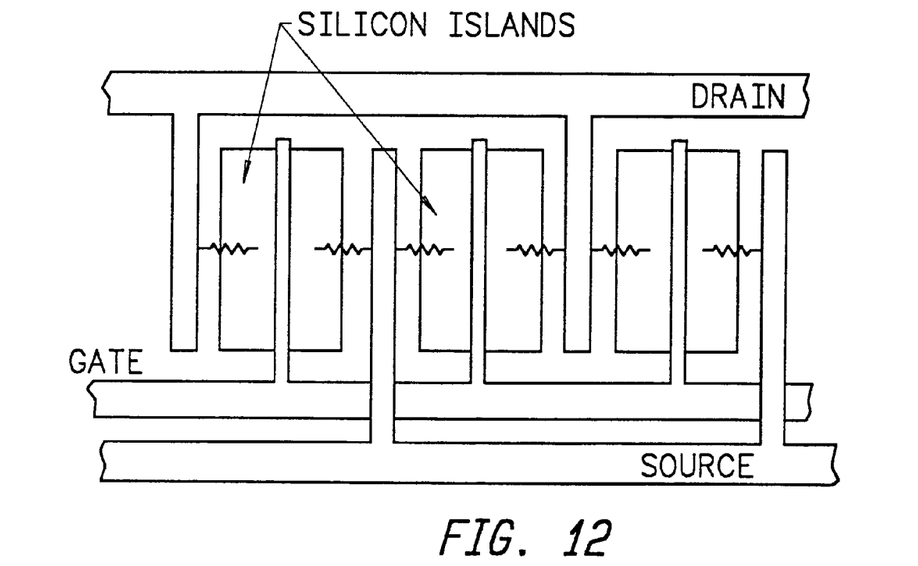
Figure 13:
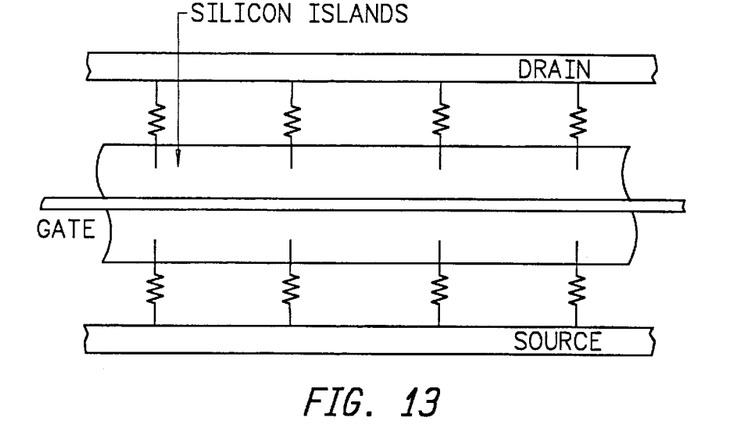
FIGS. 13 and 14 are plan views of conventional SOI ESD protection devices comprising a single silicon island.
Figure 14:
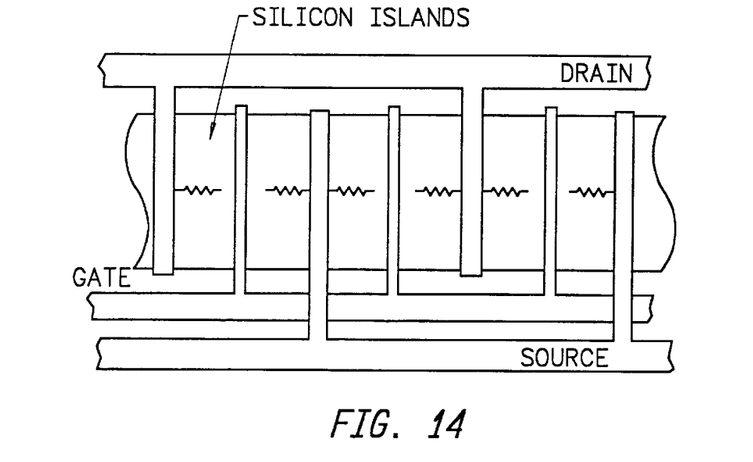
Figure 15:
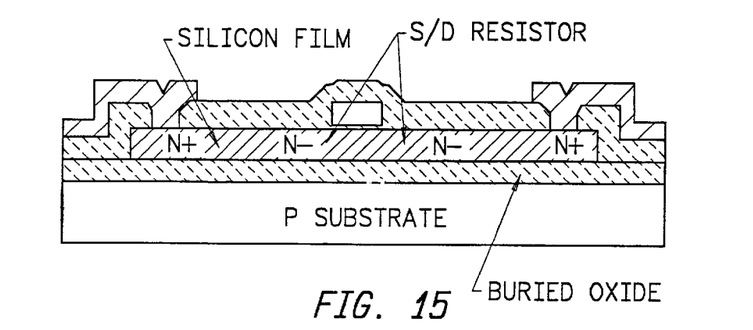
FIG. 15 is a section view illustrating the fabrication of resistors in the SOI ESD multiple island devices of FIGS. 11 and 12 fabricated in lightly-doped polysilicon films using a light-doped drain implant or source/drain diffusion.

In accordance with another feature of the invention, an ESD protection device can be built into the silicon film in thermally isolated segments to increase the ESD current handing capability. FIG. 10 is a plot illustrating a special problem of SOI ESD protection, namely, SOI ESD failure voltage does not increase significantly with increasing protection device width. This prevents the attainment of good ESD protection by simply enlarging the device width of an SOI transistor as is routinely done for bulk IC ESD protection. The problem lies in the filamentary current flow in the ESD devices under the condition of secondary breakdown. Current is concentrated at hot filaments while cold regions of a transistor carry no current. In a wide bulk transistor, there are many hot spots (filaments) and each filament can absorb certain ESD current or energy without failure. However, in an SOI device, it is unlikely to have multiple hot spots since the temperature in a silicon island tends to be more uniform even in a wide transistor because the thermally-conductive silicon island is surrounded by thermally insulating oxide. In accordance with the invention, the SOI ESD protection device is divided into a plurality of mesas or in silicon islands, each separated by oxide, as illustrated in the plan views of FIGS. 11, 12. Each island can have at least one conducting filament and absorb a certain amount of ESD energy so that the 250 μm-wide SOI device would have about 5 times larger ESD voltage as a 50 μm-wide device, rather than a similar ESD failure voltage as shown in FIG. 10. The use of multiple islands requires little more area than conventional SOI protection devices shown in FIGS. 13 and 14. The silicon islands illustrated in FIGS. 11, 12 can be created by field oxide isolation or by physical isolation through etching of mesas. The resistors in the subject of FIGS. 11 and 12 can comprise part of a lightly doped drain (LDD) structure as illustrated in FIG. 15 and are added to promote uniform distribution of the ESD current.

SOI MOSFETs in accordance with the invention improve operating characteristics and speed through use of the low barrier body contact, and the inclusion of non-fully-depleted SOI MOSFETs along with fully-depleted SOI MOSFETs in one SOI integrated circuit can be accommodated using the recessed channel structures along with multiple threshold voltage implants. Further, improved ESD for protection for SOI circuits is readily provided by forming bulk transistors directly in the underlying substrate and through the use of device segmented islands or mesas.

While the invention has been described with reference to specific embodiments, the description is illustrative of the invention and is not to be construed as limiting the invention. Various modifications and applications may occur to those skilled in the art without departing from the true spirit and scope of the invention as defined by the appended claims.

What is claimed is:

1. A silicon-on-insulator field effect transistor for use in an electrostatic discharge protection circuit comprising an insulating layer, a semiconductor material layer on said insulating layer, a plurality of phsically and electrically isolated regions of semiconductor material formed from said semiconductor material region, each isolated region having a source region spaced from a drain region by a channel region, a first interconnect means for electrically connecting all of said source regions, a second interconnect means for electrically connecting all of said drain regions, and a third interconnect means overlying all of said channel regions and functioning as a common gate.

2. The silicon-on-insulator field effect transistor as defined by claim 1 wherein said plurality of electrically isolated regions comprise physically isolated mesa structures.

* * * * *